United States Patent
Lee et al.

(10) Patent No.: US 10,876,203 B2
(45) Date of Patent: Dec. 29, 2020

(54) FUEL CELL SEPARATOR AND COATING METHOD FOR FUEL CELL SEPARATOR

(71) Applicants: HYUNDAI MOTOR COMPANY, Seoul (KR); KIA MOTORS CORPORATION, Seoul (KR); DONGWOO HST CO., LTD., Siheung-si (KR)

(72) Inventors: Seungkoo Lee, Seoul (KR); Woong Pyo Hong, Yongin-si (KR); Bokyung Kim, Yongin-si (KR); Jungyeon Park, Yongin-si (KR); Seung Jeong Oh, Suwon-si (KR); In Woong Lyo, Suwon-si (KR); Su Jung Noh, Seoul (KR); Jun Seok Lee, Incheon (KR); Won Ki Chung, Seoul (KR); Seung Gyun Ahn, Seoul (KR)

(73) Assignees: HYUNDAI MOTOR COMPANY, Seoul (KR); KIA MOTORS CORPORATION, Seoul (KR); DONGWOO HST CO., LTD., Siheung-si (KR)

( * ) Notice: Subject to any disclaimer, the term of this patent is extended or adjusted under 35 U.S.C. 154(b) by 23 days.

(21) Appl. No.: 16/406,286

(22) Filed: May 8, 2019

(65) Prior Publication Data
US 2019/0264321 A1  Aug. 29, 2019

Related U.S. Application Data

(62) Division of application No. 15/379,296, filed on Dec. 14, 2016, now Pat. No. 10,329,665.

(30) Foreign Application Priority Data

Oct. 24, 2016 (KR) .................. 10-2016-0138365

(51) Int. Cl.
*H01M 8/0247* (2016.01)
*C23C 16/26* (2006.01)
(Continued)

(52) U.S. Cl.
CPC .......... *C23C 16/26* (2013.01); *C23C 16/0227* (2013.01); *C23C 16/0245* (2013.01);
(Continued)

(58) Field of Classification Search
CPC . C23C 16/26; C23C 16/0245; C23C 16/0227; C23C 16/0263; C23C 16/50; H01M 8/0247
See application file for complete search history.

(56) References Cited

U.S. PATENT DOCUMENTS

2008/0023320 A1* 1/2008 Kobayashi .......... H01M 8/0228
                                                   204/192.32
2010/0323276 A1* 12/2010 Dadheech ........... C23C 14/5826
                                                   429/512
(Continued)

FOREIGN PATENT DOCUMENTS

| JP | H10-74527 A | 3/1998 |
| KR | 10-2016-0102782 A | 8/2016 |
| WO | 2009/093843 A2 | 7/2009 |

OTHER PUBLICATIONS https://corial.plasmatherm.com/en/technologies/pecvd-plasma-enhanced-chemical-vapor-deposition (Year: 2019).*
Jacobsohn et al. Thin Solid Films 419 (2002) 46-53 (Year: 2002).*

*Primary Examiner* — Lisa S Park
(74) *Attorney, Agent, or Firm* — McDonnell Boehnen Hulbert & Berghoff LLP (57) ABSTRACT

A fuel cell separator includes a metal substrate having a surface; an ion penetration layer including carbon diffusion-inhibiting ions extending from the surface of the metal
(Continued)

substrate into the metal substrate; and a carbon coating layer disposed on the surface of the metal substrate.

8 Claims, 10 Drawing Sheets

(51) Int. Cl.
*C23C 16/50* (2006.01)
*C23C 16/02* (2006.01)
*H01M 8/0206* (2016.01)
*H01M 8/0213* (2016.01)
*H01M 8/0228* (2016.01)

(52) U.S. Cl.
CPC .......... *C23C 16/0263* (2013.01); *C23C 16/50* (2013.01); *H01M 8/0206* (2013.01); *H01M 8/0213* (2013.01); *H01M 8/0228* (2013.01); *H01M 8/0247* (2013.01)

(56) References Cited

U.S. PATENT DOCUMENTS

| | | |
|---|---|---|
| 2012/0088185 A1 | 4/2012 | Maeda et al. |
| 2012/0171468 A1* | 7/2012 | Tanaka ................ H01M 8/0228 428/328 |
| 2014/0302416 A1 | 10/2014 | Lee et al. |

* cited by examiner

FUEL CELL SEPARATOR AND COATING METHOD FOR FUEL CELL SEPARATOR

CROSS REFERENCE TO RELATED APPLICATIONS

The present application is a divisional of U.S. patent application Ser. No. 15/379,296, filed Dec. 14, 2016 which claims priority to and the benefit of Korean Patent Application No. 10-2016-0138365 filed in the Korean Intellectual Property Office on Oct. 24, 2016. The entire disclosure contents of these applications are herewith incorporated by reference into the present application.

BACKGROUND

(a) Field of the Invention

A method of coating a fuel cell separator and a fuel cell separator are disclosed.

(b) Description of the Related Art

A fuel cell stack is a device discharging electricity, water, and heat by reacting hydrogen with oxygen in the air. The fuel cell stack may be divided into a repeatedly stacked part such as an electrode layer, a separator, a gas diffusion layer and a gasket, and a non-repeating part such as a locking element required to lock a stack module, an encloser protecting the stack, an interface with a vehicle, and a high voltage connector or the like. The fuel cell stack, however, has many inherent risks because high voltage electricity, water and hydrogen coexist in the same location.

A fuel cell separator—the most important part in the fuel cell stack—requires low contact resistance and low corrosion current. Conventional metal separators have excellent electrical conductivity but also have poor corrosion characteristics, and thus have lower durability. When hydrogen cations generated during driving using the fuel cell directly contact the separator, corrosion may occur. In particular, when an uncoated metal is used, there is a greater risk of corrosion. Moreover, electrical conductivity may decrease due to the formation of an oxide on the surface of the uncoated metal. In addition, dissociated and eluted metal cations contaminates a Membrane Electrode Assembly resulting in deteriorated performance of the fuel cell. These problems have conventionally been addressed by coating the separator.

Carbon in the coating material has high electrical conductivity and good corrosion characteristics. But when carbon is coated onto the metal layer using a plasma enhanced chemical vapor deposition ("PECVD"), the carbon atoms penetrate into the metal separator due to the high temperature of the process, weakening the bond between the metal substrate and the carbon coating layer. In this case, the weak adhesion strength and the low density of the carbon layer causes degraded contact resistance and corrosion characteristics when driving using a fuel cell.

SUMMARY

An example embodiment of the present disclosure provides a method of coating a fuel cell separator.

Another example embodiment of the present invention provides a fuel cell separator.

An example embodiment of a method of coating a fuel cell separator comprises the steps of: providing a metal substrate; forming an ion penetration layer by penetrating carbon diffusion-inhibiting ions into a surface of the metal substrate; and forming a carbon coating layer on the ion penetration layer.

After providing the metal substrate, the method may further include the step of removing an oxide film disposed on a surface of the metal substrate surface.

In forming the ion penetration layer, the carbon diffusion-inhibiting ion may be a nitrogen or boron ion.

Formation of the ion penetration layer may be performed at about 300 degrees Celsius to about 550 degrees Celsius for about 10 minutes to about 120 minutes.

Formation of ion penetration layer also may be performed under an atmosphere including about 10 volume % or greater of an ion-forming gas.

Formation of the ion penetration layer also may include penetrating carbon diffusion-inhibiting ions by plasma or ion implantation.

Formation of the carbon coating layer may be performed at about 300 degrees Celsius to about 550 degrees Celsius.

Formation of the carbon coating layer may include exciting a carbon atom in a carbon precursor gas using plasma to form the carbon coating layer.

Formation of the carbon coating layer may be performed under an atmosphere including about 3 volume % to about 30 volume % of a carbon precursor gas.

An example embodiment of a fuel cell separator according to the present disclosure comprises: a metal substrate; an ion penetration layer including carbon diffusion-inhibiting ions extending from a surface of the metal substrate into the metal substrate; and a carbon coating layer disposed on the ion penetration layer.

The carbon diffusion-inhibiting ion of the ion penetration layer may be interposed between metal atoms of the metal substrate.

The ion penetration layer may include about 5 wt % to about 30 wt % of the carbon diffusion-inhibiting ion.

The ion penetration layer may include about 5 wt % to about 85 wt % of carbon.

The carbon diffusion-inhibiting ion may include a nitrogen or boron ion.

The thickness of the ion penetration layer may range from about 30 nm to about 300 nm.

The thickness of the carbon coating layer may range from about 10 nm to about 1000 nm.

The density of the carbon coating layer may range from about 2.0 g/cm$^3$ to about 3.0 g/cm$^3$.

In an example embodiment, the binding force of the carbon coating layer is enhanced due to the presence of the ion penetration layer.

In a further example embodiment, the density of the carbon coating layer is enhanced due to the presence of the ion penetration layer.

In an example embodiment, the fuel cell separator has low contact resistance and corrosion potential characteristics.

DETAILED DESCRIPTION

The advantages and features of the present invention and the methods for accomplishing the same will be apparent from the example embodiments described hereinafter with reference to the accompanying drawings. However, the present invention is not limited to the example embodiments described hereinafter, but may be embodied in many different forms. The following example embodiments are provided to make the disclosure of the present invention complete and to allow those skilled in the art to clearly understand the scope of the present invention, and the present invention is defined only by the scope of the appended claims. Throughout the specification, the same reference numerals denote the same elements.

It will be understood that when an element is referred to as being "on" another element, it can be directly on the other element or intervening elements may also be present. In contrast, when an element is referred to as being "directly on" another element, there are no intervening elements present.

In some example embodiments, detailed descriptions of well-known technologies will be omitted. Unless otherwise defined, all terms (including technical and scientific terms) used herein have the same meaning as commonly understood by one of ordinary skill in the art. In addition, unless explicitly described to the contrary, the word "comprise" and variations such as "comprises" or "comprising", will be understood to imply the inclusion of stated elements but not the exclusion of any other elements. Further, as used herein, the singular forms are intended to include the plural forms as well, unless the context clearly indicates otherwise.

Figure 1:
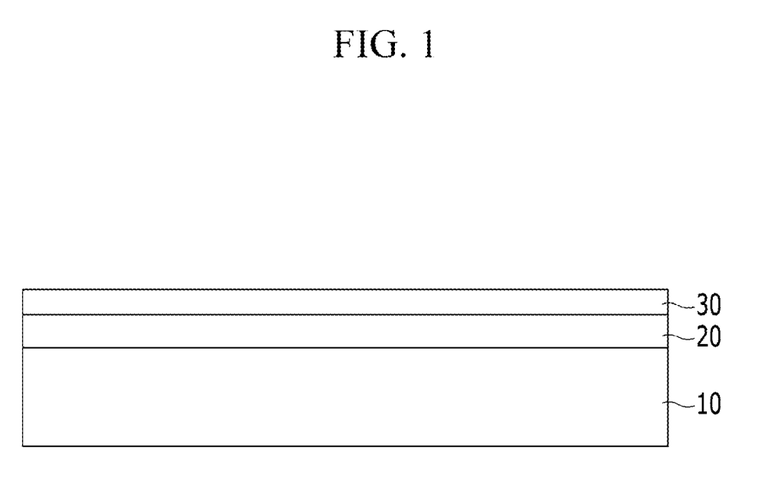
FIG. 1 is a schematic view showing a cross-section of an example embodiment of a fuel cell separator.

FIG. 1 is a schematic view showing a cross-section of an example embodiment of a fuel cell separator.

Referring to FIG. 1, a separator 100 [need to show on FIG. 1] for an example embodiment of a fuel cell separator comprises: a metal base layer 10; an ion penetration layer 20 including carbon diffusion-inhibiting ions 21 that penetrate into the surface of metal substrate 10; and a carbon coating layer 30 disposed on ion penetration layer 20. The fuel cell separator 100 shown in FIG. 1 is merely an example, but the present invention is not limited thereto.

Hereinafter, each component of fuel cell separator 100 is described.

Metal base layer 10 may be composed of a variety of materials. In one example embodiment, metal substrate 10 may be a stainless steel sheet. In a further example embodiment, metal substrate 10 may be an SUS 300-based steel sheet.

Figure 2:
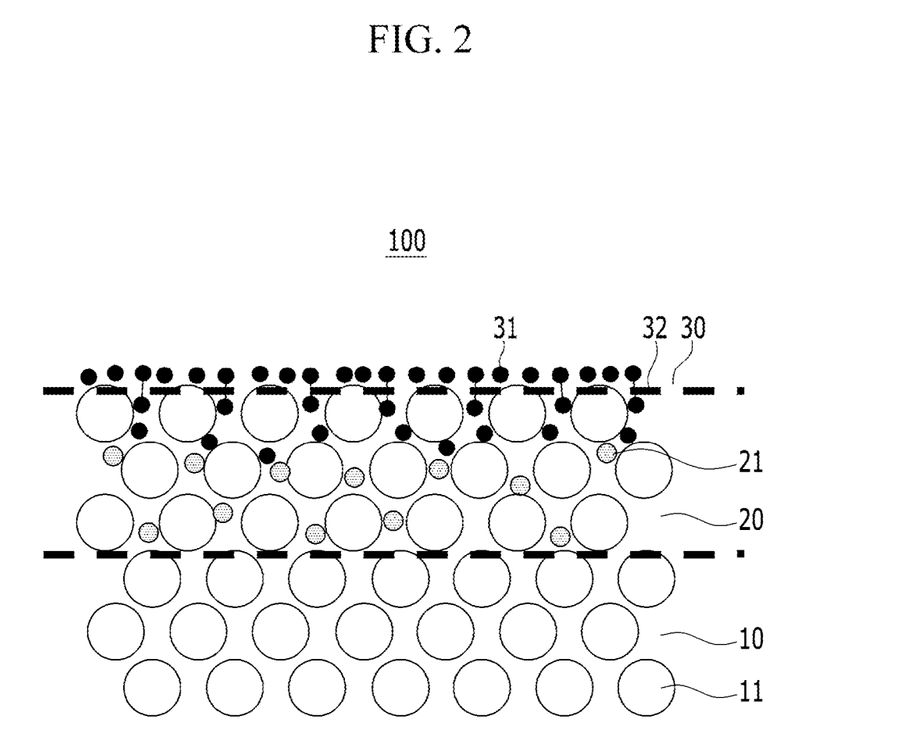
FIG. 2 is a schematic view showing a detailed cross-section of the layers of a fuel cell separator.

As shown in FIG. 2, in an example embodiment, an ion penetration layer 20 extends from the surface of metal substrate 10 into metal substrate 10. Ion penetration layer includes carbon diffusion-inhibiting ions 21 that assist in improving the binding force and the density of the carbon coating layer 30, and ultimately, the contact resistance and corrosion characteristics of fuel cell separator 100.

FIG. 2 is a schematic view showing a cross-section of an example embodiment of a fuel cell separator 100. As shown in FIG. 2, ion penetration layer 20 includes carbon diffusion-inhibiting ions 21, wherein the carbon diffusion-inhibiting ions 21 are disposed in the spaces between the metal atoms 11 comprising metal substrate 10. Carbon diffusion-inhibiting ions 21 of Ion penetration layer 20 prevent carbon atoms disposed on the surface of metal substrate 10 (e.g. from application of a carbon coating layer 30) from diffusing into the metal substrate 10. Because diffusion of carbon atoms 21 into metal substrate 10 is prevented, the majority of the carbon atoms 31 in carbon coating layer 30 remain on the surface of metal substrate 10. Carbon atoms 31 on the surface of metal substrate 10 may make carbon-carbon bonds 32 with other carbon atoms in the carbon coating layer, so the binding force between the carbon coating layer 30 and the metal substrate 10 may be enhanced and the density of the carbon coating layer 30 is improved. Thus, fuel cell separator 100 may have low contact resistance and corrosion potential characteristics.

Figure 3:
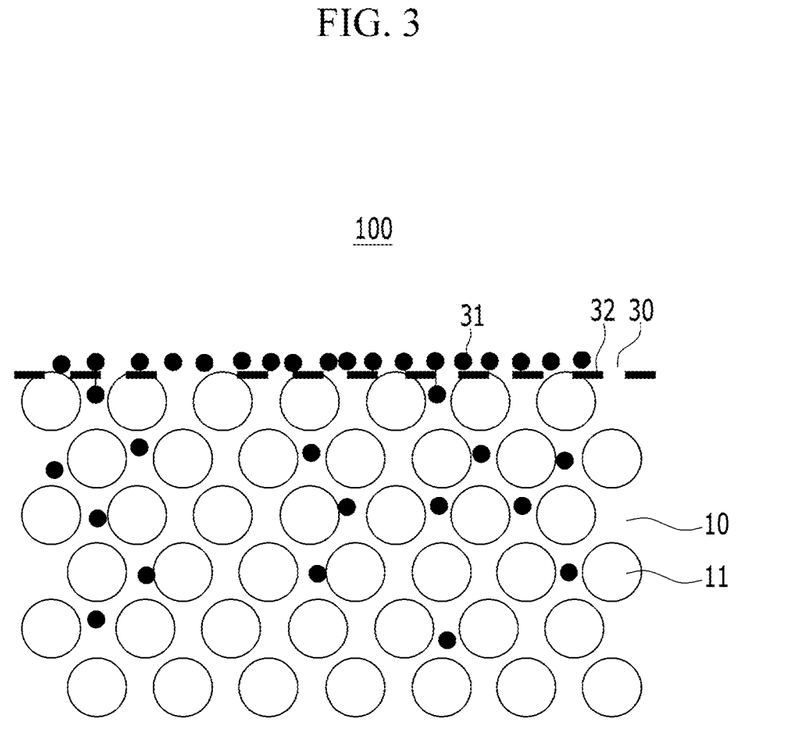
FIG. 3 is a schematic view showing a cross-sectional view of a surface of an example embodiment fuel cell separator having a carbon coating but no ion penetration layer.

In contrast, as shown in FIG. 3, when ion penetration layer 20 is not formed prior to application of carbon coating layer 30, the carbon atoms 31 in carbon coating layer 30 diffuse into metal substrate 10 between metal atoms 11. As a result, only a small amount of the carbon atoms 31 in carbon coating layer 30 remain on the outermost surface of metal substrate 10, and the binding force and density of carbon coating layer 30 are diminished.

Like this, according to an example embodiment of the present invention, by providing the ion penetration layer 20 in which the carbon diffusion-inhibiting ion 21 is interposed between metal atoms 11 of the metal substrate 10, the fuel cell separator 100 may have low contact resistance and corrosion potential characteristics. In an example embodiment, metal substrate 10 may be a stainless steel sheet and metal atom 11 of metal substrate may include a metal atom present in the stainless steel sheet, for example, iron (Fe), chromium (Cr), nickel (Ni), or molybdenum (Mo). As used herein, the term "interposing the carbon diffusion-inhibiting ion 21 between metal atoms 11" means that the carbon diffusion-inhibiting ion 21 is penetrated or solid-solved in the austenite face centered cubic structure (FCC) lattice.

Ion penetration layer 20 may include from about 5 wt % to about 30 wt % of carbon diffusion-inhibiting ion 21. When the amount of carbon diffusion-inhibiting ion 21 is too low, the ability of ion penetration layer to prevent diffusion of carbon into metal substrate 10 is insufficient. When the amount of carbon diffusion-inhibiting ion 21 is too high, it may be delaminated from metal substrate 10 by an external impact due to hardening of the surface. Thus, the fuel cell separator has low durability.

In addition, during formation of carbon coating layer 30, carbon atoms 31 in carbon coating layer 30 may partially diffuse into ion penetration layer 20, so that the composition of the ion penetration layer is from about 5 to about 85 wt % of carbon atoms 31. When the amount of carbon atoms 31 diffusing into ion penetration layer 20 is too low, the formation of carbon-carbon bonds 32 between carbon atoms in the ion penetration layer and carbon atoms in the carbon coating layer 30 is reduced, resulting in a lower binding force of carbon coating layer 30. When the amount of carbon atoms 31 diffusing into ion penetration layer 20 is too high, the density of carbon coating layer 30 is decreased.

Carbon diffusion-inhibiting ion 21 may be any ion capable of inhibiting the diffusion of carbon atoms 31 by being interposed between metal atoms 11 in metal substrate 10. In an example embodiment, carbon diffusion-inhibition ion 21 may be any ions having an atomic number of less than or equal to 20. In a further example embodiment, carbon diffusion-inhibiting ion 21 may be a nitrogen ion or a boron ion.

Ion penetration layer 20 may have a thickness of from about 30 nm to about 300 nm. When ion penetration layer 20 is too thin, ion penetration layer 20 may be unable to sufficiently prevent diffusion of carbon atoms into metal substrate 10. When ion penetration layer 20 is too thick, the hardness of the fuel cell separator may be excessively increased if too much nitrogen penetrates into ion penetration layer 20, resulting in the fuel cell separator being easily broken by an external impact.

Ion penetration layer 20 may be formed by plasma or ion implantation. An example method of forming ion penetration layer 20 as part of an example method of coating a fuel cell separator is described in detail later.

Carbon coating layer 30 is disposed on the ion penetration layer 20. Application of carbon coating layer 30 may ensure that the fuel cell separator has high electrical conductivity and low corrosion potential.

Carbon coating layer 30 may have a thickness of from about 10 nm to about 1000 nm. When carbon coating layer 30 is too thin, it is insufficient to provide the desired electrical conductivity and corrosion characteristics. When the carbon coating layer 30 is too thick, stresses applied to the fuel cell separator may cause delamination of carbon coating layer 30 from metal substrate 10. In a further example embodiment, the thickness of the carbon coating layer 30 is from about 20 nm to about 100 nm.

According to another example embodiment, the density of carbon coating layer 30 may be increased due to formation of ion penetration layer 20. In a further example embodiment, the density of carbon coating layer 30 may range from about 2.0 g/cm$^3$ to about 3.0 g/cm$^3$.

A method of coating a fuel cell separator 100 according to an example embodiment includes the steps of: providing a metal substrate 10; forming an ion penetration layer 20 by penetrating carbon diffusion-inhibiting ions 21 into a surface of metal substrate 10; and forming a carbon coating layer 30 on ion penetration layer 20. Each step is described in greater detail below.

First, a metal substrate 10 is provided. The metal substrate 10 may include any metal typically used for a fuel cell separator 100 without limitation. In one example embodiment, metal substrate 10 may be composed of a stainless steel sheet. In a further example embodiment, metal substrate 10 may be composed of a SUS 300-based steel sheet.

An oxide film may form on the surface of the metal substrate 10 due to contacting with air, for example. Because the oxide film increases contact resistance, in a further example embodiment, the method may further include the step of removing an oxide film from the surface of metal substrate 10 prior to formation of ion penetration layer 20.

The oxide film may be removed by, for example, heating metal substrate 10 and applying argon plasma.

Ion penetration layer 20 by penetrating carbon diffusion-inhibiting ions 21 into the surface of the metal substrate 10. Ion penetration layer 20 extends from the surface of metal substrate 10 into metal substrate 10.

Plasma or ion implantation may be used to implant carbon diffusion-preventing ions 21 into metal substrate 10. The method of using plasma includes applying plasma under an ion-forming gas atmosphere for providing carbon diffusion-inhibiting ions 21 to penetrate into metal substrate 10. The method of ion implantation includes accelerating ions using high energy to cause the ions to collide with and penetrate into the surface of metal substrate 10.

Carbon diffusion-inhibiting ions 21 may be any ions capable of inhibiting the diffusion of carbon atoms 31 by blocking the spaces between metal atoms 11. In an example embodiment, carbon diffusion-inhibiting ions are ions having an atomic number of less than or equal to 20. In a further example embodiment, carbon diffusion-inhibiting ion 21 is a nitrogen ion or a boron ion.

When plasma is used to form ion penetration layer 30, the ion-forming gas is a gas including carbon diffusion-inhibiting ion 21. For example, the ion-forming gas may include nitrogen gas ($N_2$), borane gas ($B_2H_6$), etc. Plasma implantation may be performed under conditions where the ion forming gas is present in an amount greater than or equal to about 10 volume %. When the amount of ion-forming gas is insufficient, carbon diffusion-inhibiting ions 21 may not sufficiently penetrate into metal substrate 10. The balance of the gas used in the plasma implantation process may be hydrogen gas.

Formation of on penetration layer 20 may be performed at a temperature of about 300 to about 550 degrees Celsius. When the temperature is too low, carbon diffusion-inhibiting ions 21 may not sufficiently penetrate metal substrate 10. When the temperature is too high, the metal in metal substrate 10 may react with carbon diffusion-inhibiting ions 21, resulting in diminished corrosion characteristics and increased contact resistance. For example, if chromium in metal substrate 10 reacts with nitrogen as carbon diffusion-inhibiting ion 21 to form a chromium nitride (CrN, $Cr_2N$), the corrosion resistance of the fuel cell separator degrades, and the contact resistance increases.

In a further example embodiment, ion penetration layer 20 is formed at a low temperature, which is different from a nitriding process of adding nitrogen at a high temperature.

The process of forming ion penetration layer 20 may last from about 10 to about 120 minutes. If the formation time is too short, carbon diffusion-inhibiting ions 21 may not sufficiently penetrate metal substrate 10. Even when the formation time is prolonged, the amount of carbon diffusion-inhibiting ion 21 penetrating metal substrate 10 is limited.

Next, a carbon coating layer 30 is formed on ion penetration layer 20. Carbon coating layer 30 may be formed by methods including plasma-enhanced chemical vapor deposition ("PECVD"). Specifically, the method includes using plasma to excite carbon atoms in a carbon precursor gas to provide carbon coating layer 30.

The carbon coating layer formation method may be performed in an atmosphere including about 3 volume % to about 30 volume % of a carbon precursor gas. When the amount of the carbon precursor gas is too low, carbon coating layer 30 may not properly form on metal substrate 10. When the amount of the carbon precursor gas is too high, an increase in residual stress in carbon coating layer 30 may lead to delamination of carbon coating layer 30. In a further example embodiment, the carbon coating layer formation method may be performed under an atmosphere including about 10 volume % to about 20 volume % of a carbon precursor gas. The carbon precursor gas can be any capable of exciting a carbon atom by applying plasma. Specifically, the carbon precursor gas may be a hydrocarbon gas. More specifically, the carbon precursor gas may include $C_2H_2$, $CH_4$, or $C_2H_6$. The balance of the gas used in the process other than the carbon precursor gas may be argon or hydrogen gas.

Formation of carbon coating layer 30 may be performed at a temperature of from about 300 to about 550° C. When the temperature is too low, carbon coating layer 30 may not properly form on the surface of metal substrate 10. When the temperature is too high, a chromium carbide ($Cr_7C_3$) is formed, resulting in lower corrosion resistance.

The example embodiments of a fuel cell separator described above have improved corrosion resistance and conductivity, and are therefore useful for application in a fuel cell.

Hereinafter, examples of the present invention and comparative examples are described. These examples, however, should not in any sense be interpreted as limiting the scope of the present invention.

EXAMPLE 1

SUS 316L, an austenite-based stainless steel, was used as metal substrate. The metal substrate was heated to 300° C. under an argon atmosphere and then contacted with plasma to remove an oxide film formed on the surface of the metal substrate. Next, the metal substrate was heated to 400° C. The argon atmospheric gas was replaced with 15 volume % of nitrogen and 85 volume % of hydrogen, the metal substrate was contacted with plasma for 10 minutes to allow nitrogen ion to penetrate the metal substrate. The atmospheric gas was again replaced with 20 volume % of acetylene ($C_2H_2$) and 80 volume % of hydrogen, and the metal substrate was contacted with plasma for 30 minutes to generate a carbon coating layer.

The resulting fuel cell separator had a thickness of 500 nm.

Figure 4:
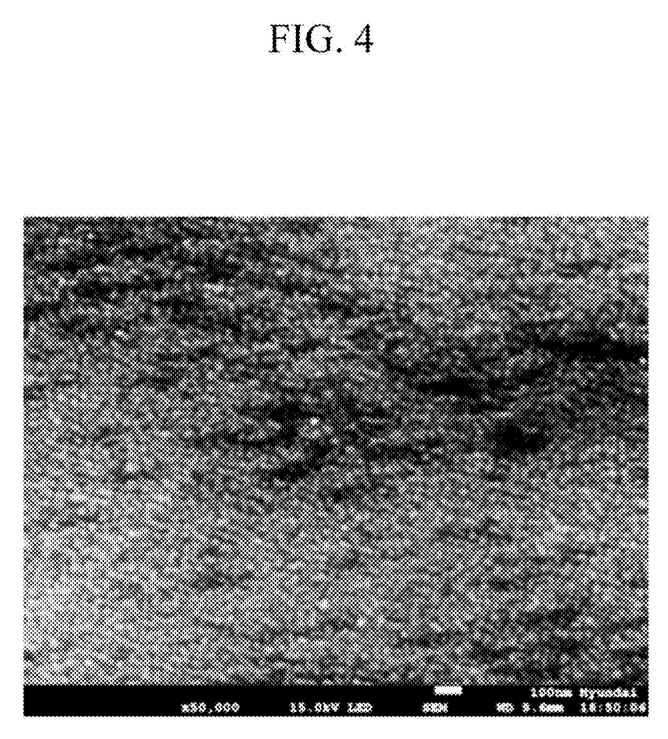
FIG. 4 is a scanning electron microscopic ("SEM") image showing a surface of a carbon coating layer in an example embodiment of a fuel cell separator according to Example 1.

FIG. 4 is a scanning electron microscopic (SEM) image showing a surface of the carbon coating layer of the fuel cell separator obtained from Example 1. FIG. 4 confirms that the process formed a dense carbon coating layer on the entire surface of the metal substrate.

Figure 5:
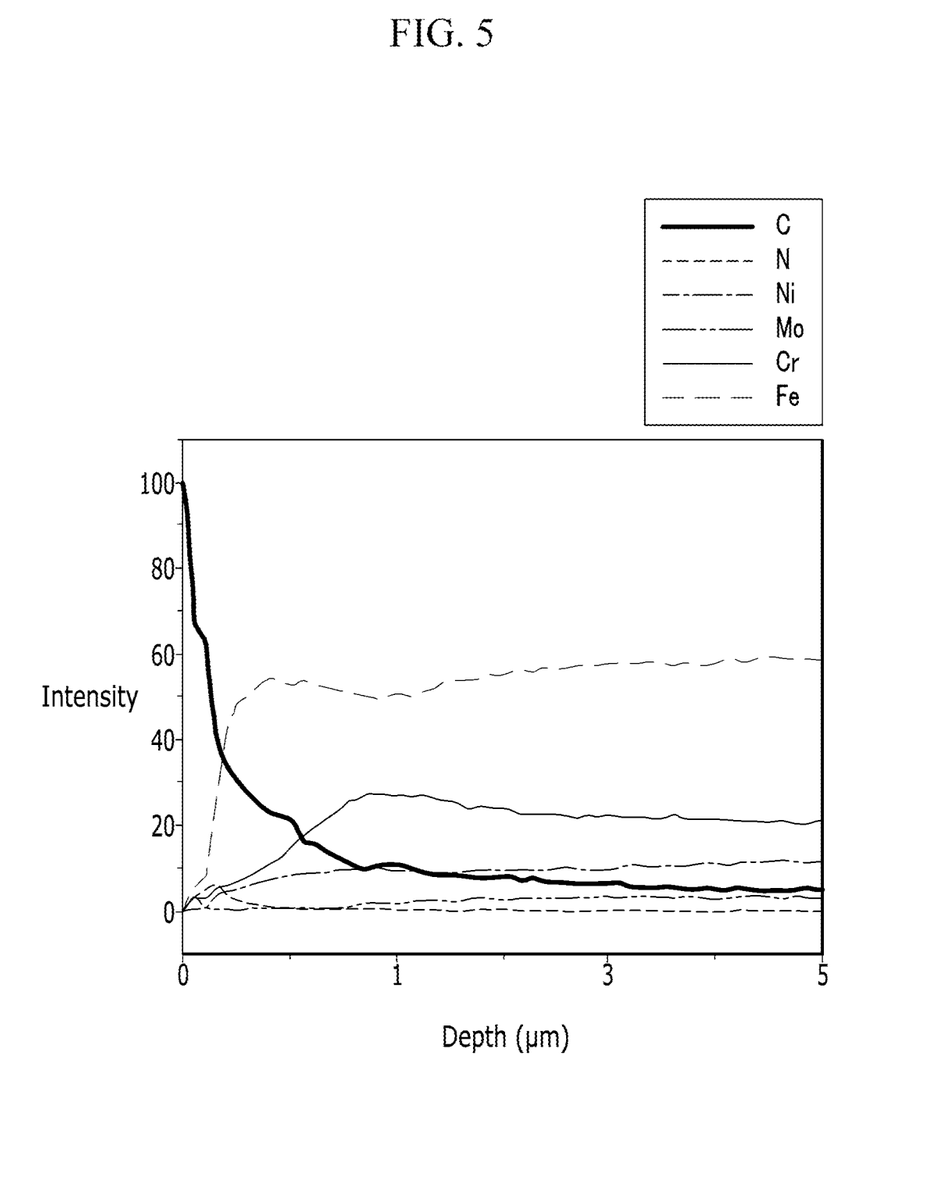
FIG. 5 is a graph of the results from a Glow Discharge Optical Emission Spectroscopy ("GD-OES") test of an example embodiment of a fuel cell separator according to Example 1.

FIG. 5 shows the results of a GD-OES of the fuel cell separator according to Example 1. As shown in FIG. 5, a carbon coating layer including greater than or equal to 70 wt % of carbon was formed to a depth of 20 nm, and beneath the carbon coating layer, an ion penetration layer including 5 wt % to 30 wt % of nitrogen was formed to a depth of 100 nm.

The density of the carbon coating layer was determined to be 2.68 g/cm3.

EXAMPLE 2

Example 2 was prepared according to the same procedure as in Example 1, except that the nitrogen ion was allowed to penetrate the metal substrate for 20 minutes during formation of the ion penetration layer.

EXAMPLE 3

Example 3 was prepared according to the same procedure as in Example 1, except that the nitrogen ion was allowed to penetrate the metal substrate for 30 minutes during formation of the ion penetration layer.

EXAMPLE 4

Example 4 was prepared according to with the same procedure as in Example 1, except that the nitrogen ion was allowed to penetrate the metal substrate for 40 minutes during formation of the ion penetration layer.

COMPARATIVE EXAMPLE

SUS 316L, an austenite-based stainless steel, was used as the metal substrate. The metal substrate was heated to 300° C. under an argon atmosphere and then contacted with plasma to remove an oxide film formed on a surface of the metal substrate. The argon atmospheric gas was replaced with 20 volume % of acetylene ($C_2H_2$) and 80 volume % of hydrogen, and the metal substrate was contacted with plasma for 30 minutes to generate a carbon coating layer.

The resulting fuel cell separator had a thickness of 500 nm.

Figure 6:
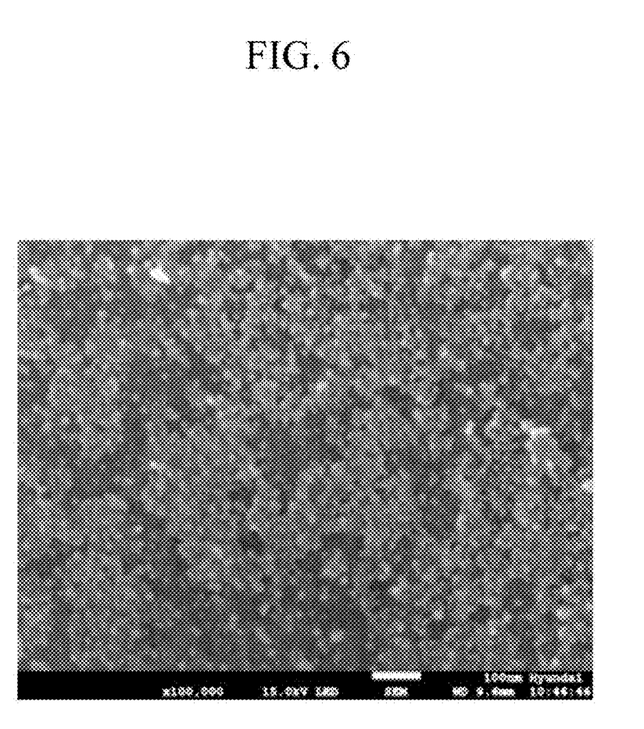
FIG. 6 is an SEM image showing a surface of a carbon coating layer of an example embodiment of a fuel cell separator according to Comparative Example 1.

FIG. 6 is a scanning electron microscopic (SEM) image showing a surface of the carbon coating layer of the fuel cell separator obtained from Comparative Example 1. As shown in FIG. 6, the carbon coating layer formed in islands rather than as a dense carbon coating layer.

EXPERIMENTAL EXAMPLE 1

Evaluation of Adhesion Strength

Figure 7:
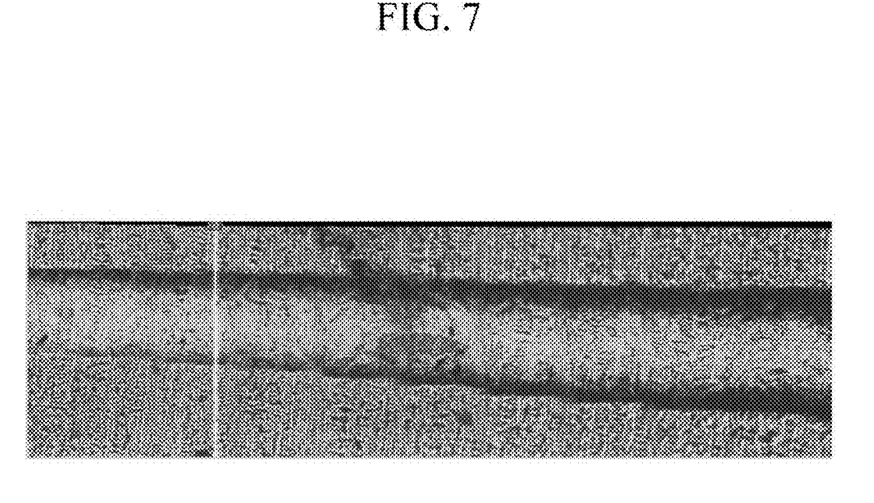
FIG. 7 is an optical microscopic (OM) photograph of an example embodiment of a fuel cell separator according to Example 1 after evaluating adhesion strength.
Figure 8:
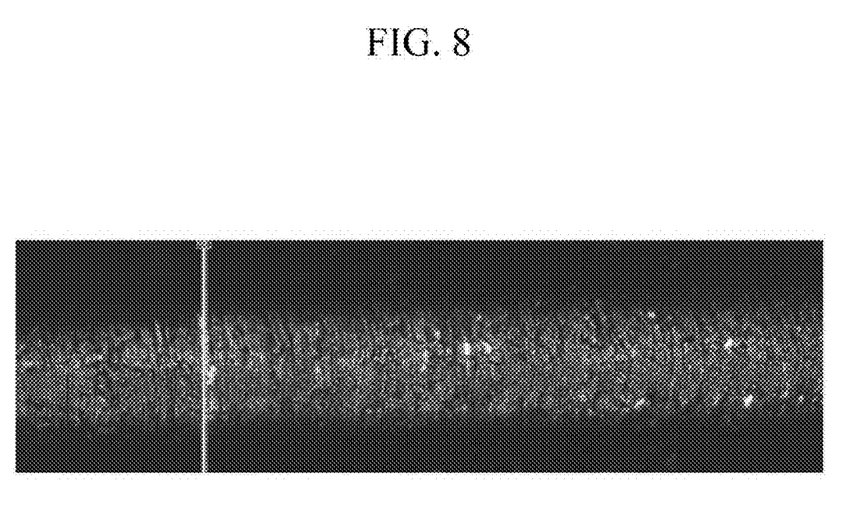
FIG. 8 is an optical microscopic (OM) photograph of an example embodiment of a fuel cell separator according to Comparative Example 1 after evaluating adhesion strength.

Adhesion strength was evaluated while increasing pressure up to 50 N for each fuel cell separator obtained from Example 1 and Comparative Example, and the results are shown in FIG. 7 and FIG. 8.

As shown in FIG. 7, delamination did not occur in the fuel cell separator of from Example 1 even when pressure was increased to 50N. In contrast, as shown in FIG. 8, delamination occurred in the fuel cell separator of the Comparative Example when the pressure exceeded 8.2N (white line). The white spot indicates the metal substrate in the drawing.

EXPERIMENTAL EXAMPLE 2

Evaluation of Contact Resistance and Corrosion Current Density

Figure 9:
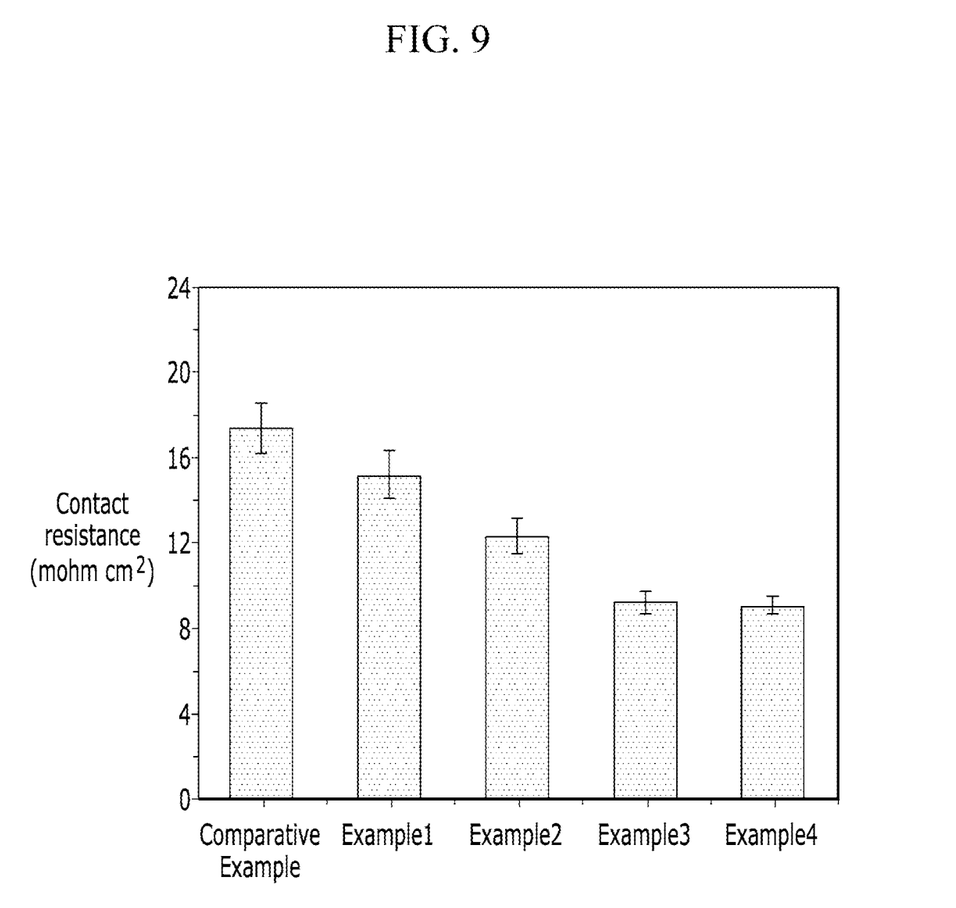
FIG. 9 is a graph showing the results of evaluating contact resistance for example fuel cell separators according to Examples 1 to 4 and Comparative Example.
Figure 10:
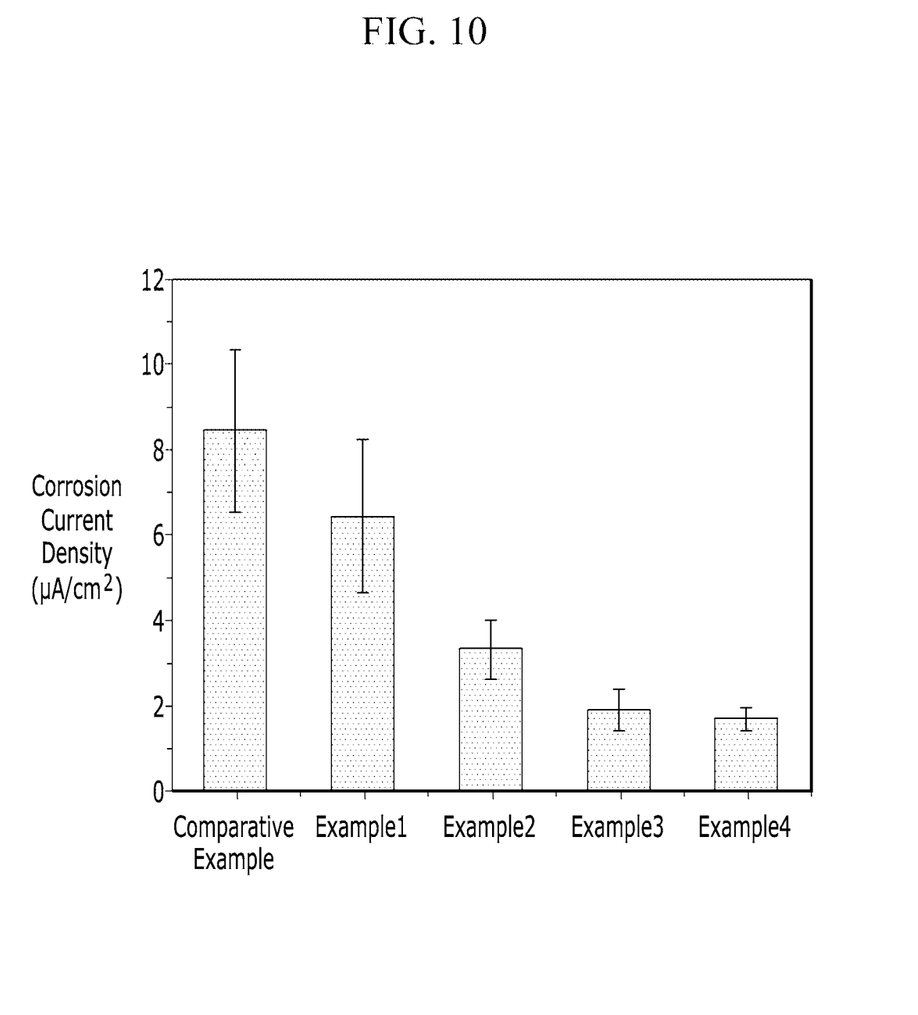
FIG. 10 is a graph showing the results of evaluating corrosion current density for example fuel cell separators according to Examples 1 to 4 and Comparative Example.

A contact resistance and a corrosion current density were measured for each fuel cell separator obtained from Examples 1 to 4 and Comparative Example, and the results are shown in FIGS. 9 and 10.

Contact resistance was measured using a contact resistance tester after disposing the separator and the gas diffusion layer between two copper plates and compressing them at 10 kgf/cm².

Corrosion current density was measured using a 0.1N $H_2SO_4$+2 ppm HF solution. The solution was heated at 65 degrees Celsius and bubbled with air for 1 hour, and then it was measured within a −0.25 to 1V vs SCE range, and the physical properties were compared and evaluated using the data of the cathode environment (0.6V vs SCE).

As shown in FIG. 9 and FIG. 10, in a case of the Comparative Example having no ion penetration layer, both contact resistance and the corrosion characteristics were inferior to those of Examples 1 to 4.

As also shown in FIGS. 9 and 10, as the time of formation of the ion penetration layer increased, contact resistance decreased and the fuel cell exhibited improved corrosion characteristics.

While this invention has been described in connection with practical example embodiments, it is to be understood that the invention is not limited to the disclosed embodiments, but, on the contrary, is intended to cover various modifications and equivalent arrangements included within the spirit and scope of the appended claims. Therefore, the embodiments described above should be understood to be examples but not limiting the present invention in any way.

The invention claimed is:

1. A method of coating a fuel cell separator, comprising the steps of: providing a metal substrate having a surface; forming an ion penetration layer extending from the surface into the metal substrate by penetrating carbon diffusion-inhibiting ions into the surface of the metal substrate; and forming a carbon coating layer on the surface of the metal substrate; wherein the forming of the carbon coating layer includes exciting a carbon atom in a carbon precursor gas by plasma to form the carbon coating layer, wherein after forming the carbon coating layer, the ion penetration layer includes 5 wt % to 30 wt % of the carbon diffusion-inhibiting ions and 5 wt % to 85 wt % of carbon atoms.

2. The method of claim 1, wherein the method further comprises removing an oxide film disposed on a surface of the metal substrate surface prior to forming the ion penetration layer.

3. The method of claim 1, wherein at least one of the carbon diffusion-inhibiting ions is a nitrogen ion or a boron ion.

4. The method of claim 1, wherein formation of the ion penetration layer is performed at a temperature of from 300 degrees Celsius to 550 degrees C. for 10 minutes to 120 minutes.

5. The method of claim 1, wherein formation of the ion penetration layer is performed under an atmosphere including 10 volume % or greater of an ion-forming gas.

6. The method of claim 1, wherein formation of the ion penetration layer includes penetrating carbon diffusion-inhibiting ions into the metal substrate using plasma or ion implantation.

7. The method of claim 1, wherein formation of the carbon coating layer is performed at a temperature of from 300 degrees Celsius to 550 degrees Celsius.

8. The method of claim 1, wherein formation of the carbon coating layer is performed under an atmosphere including 3 volume % to 30 volume % of a carbon precursor gas.

* * * * *